United States Patent [19]
Miyasaka

[11] Patent Number: 5,287,023
[45] Date of Patent: Feb. 15, 1994

[54] REVERSE-BIAS CONTROL CIRCUIT FOR A VOLTAGE-DRIVEN SWITCHING ELEMENT

[75] Inventor: Tadashi Miyasaka, Nagano, Japan

[73] Assignee: Fuji Electric Co., Ltd., Kawasaki, Japan

[21] Appl. No.: 973,575

[22] Filed: Nov. 9, 1992

[30] Foreign Application Priority Data

Nov. 7, 1991 [JP] Japan .................. 3-290266

[51] Int. Cl.$^5$ ............... H03K 17/687; H03K 17/28
[52] U.S. Cl. ........................ 307/594; 307/571; 307/268; 307/595; 307/246
[58] Field of Search ............ 307/590, 592, 593, 594, 307/597, 549, 552, 555, 633, 253, 268, 247.1, 571, 246, 268, 270, 595

[56] References Cited

U.S. PATENT DOCUMENTS

| | | | |
|---|---|---|---|
| 4,461,966 | 7/1984 | Hebenstreit | 307/246 |
| 4,581,542 | 4/1986 | Steigerwald | 307/633 |
| 4,967,101 | 10/1990 | Nakamura et al. | 307/270 |
| 4,970,420 | 11/1990 | Billings | 307/270 |

FOREIGN PATENT DOCUMENTS 0389154 3/1990 European Pat. Off.
US9006561 11/1990 PCT Int'l Appl.

Primary Examiner—John S. Heyman
Assistant Examiner—My Trang Ton
Attorney, Agent, or Firm—Brumbaugh, Graves, Donohue & Raymond

[57] ABSTRACT

In a reverse-bias control circuit for a voltage-driven switching element which turns on upon receiving a forward-bias voltage and turns off upon receiving a reverse-bias voltage, a step-down circuit is included which serves for stepping down a reverse-bias voltage after a time delay which is substantially equal to the turn-off delay of the voltage-driven switching element. The control circuit further includes a recovery circuit for stopping operation of the step-down circuit after a delay which is substantially equal to the total turn-off time of the voltage-driven switching element. The reverse-bias control circuit serves to reduce the reverse-bias voltage, thereby blocking surge-voltage disturbances, without increasing the turn-off delay time.

10 Claims, 3 Drawing Sheets

REVERSE-BIAS CONTROL CIRCUIT FOR A VOLTAGE-DRIVEN SWITCHING ELEMENT

BACKGROUND OF THE INVENTION

The present invention relates to a reverse-bias control circuit for blocking a surge voltage generated by turn-off of a voltage-driven switching element such as a power metal-oxide-semiconductor field-effect transistor (MOSFET) or an insulated gate bipolar transistor (IGBT). Such transistors may be used as high-speed switching elements of inverters for controlling, e.g., machine-tool motors, robots, or air conditioning devices, or in outage-protected power systems for office automation devices and medical equipment.

The present invention represents a major improvement over the prior art which is discussed herein with reference to FIG. 5 (a circuit diagram for a conventional switching circuit with an IGBT as a voltage-driven switching element) and FIG. 6 (a timing diagram for turn-off in a conventional switching circuit).

When a voltage-driven switching element such as the IGBT 1 is to be switched by applying a bias voltage $V_{GE}$ from the drive circuit 2 between the gate terminal G and the emitter terminal E of the IGBT, it is known that the speed of turn-off can be increased by dropping the turn-off time $t_{off}$ to 1 microsecond or less, e.g., by changing the bias voltage $V_{GE}$ step-wise from the forward-bias voltage $+V_{GE}$ to $-V_{GE}$. As a further benefit during turn-off, malfunctioning due to so-called single-transistor noise can be prevented.

Concomitantly, however, the rate of change (di/dt) of the collector current IC during turn-off may become so great that a surge voltage $V_{SG}$ is generated by superposition, on the wave front of the voltage $V_{CE}$ between collector C and the emitter E, of a voltage resulting from resonance of the collector-current change with the main-circuit internal inductance of the module, or with the external inductance in the module-connecting wiring. Breakdown failure can occur if the surge voltage exceeds the withstand voltage of the IGBT.

It is known that the di/dt-characteristics of a voltage-driven switching element such as an IGBT, for example, have a reverse-bias voltage dependence, and that di/dt can be reduced by decreasing or stepping down the reverse-bias voltage $V_{GE}$. However, simply decreasing the reverse-bias voltage results in an increased turn-off delay time $t_d$ (see FIG. 2) and in increased loss, so that the range of safe reverse-bias operation is narrowed. Inconveniently, moreover, when two IGBT's are connected in series in an inverter circuit, the dead-zone time for preventing short circuits from above and below must be increased, because the device response characteristics are impaired.

SUMMARY OF THE INVENTION

In a preferred reverse-bias control circuit, the reverse-bias voltage can be stepped down without increasing the turn-off delay time, so that surge-voltage disturbances are blocked and turn-off speed is increased in a voltage-driven switching element. Such a reverse-bias control circuit, for a voltage-driven switching element which turns on upon receiving a forward-bias voltage and turns off upon receiving a reverse-bias voltage, comprises a step-down circuit for stepping down a reverse-bias voltage after a delay corresponding to a first time interval substantially equal to the turn-off delay of the voltage-driven switching element upon the voltage-driven switching element receiving the reverse-bias voltage. The control circuit further comprises a recovery circuit for stopping the step-down operation at the end of a second time interval substantially equal to the total turn-off time of the voltage-driven switching element, which is equal to the sum of the first time interval and the fall time of the voltage-driven switching element.

DESCRIPTION OF PREFERRED EMBODIMENTS

A reverse-bias control circuit is equipped with a voltage step-down circuit, which operates with a time delay corresponding to the delay in turning off the voltage-driven switching element upon receiving a reverse-bias voltage, to decrease the reverse-bias voltage down to a predetermined level during the time corresponding to the fall time of the flowing current, and a recovery circuit for issuing a signal for stopping the step-down circuit at the end of the turn-off time, corresponding to the sum of the turn-off delay time and the fall time. As a result, di/dt and the surge voltage caused therefrom are reduced, by limiting the voltage-decrease period for the reverse-bias voltage to the fall time of the current flowing in the voltage-driven switching element, so that breakdown failure due to the surge voltage exceeding the withstand voltage is prevented, and so that the reverse-bias safe-operation range is not reduced due to increased turn-off delay caused by the reduction of the reverse-bias voltage and increased loss generated thereby. Thus, a voltage-driven switching element is obtained with faster turn-off, while maintaining reliability with respect to the element withstand voltage and the safe operation region. The reverse-bias control circuit can be made small and integrated on a single chip.

A preferred reverse-bias control circuit includes a voltage step-down circuit and a recovery circuit. The voltage step-down circuit includes a transistor, a Zener diode and a reverse-blocking diode connected in series, and a turn-off delay time-setting timer including a resistor and a capacitor in series. The recovery circuit consists of a capacitor which is connected parallel to the capacitor of voltage step-down section, and a turn-off time-setting timer including a resistor and a capacitor in series, between which the base of the transistor is connected.

Moreover, if the circuit has reverse blocking diodes connected in series on the emitter side of the transistor in a direction blocking a forward-bias current, then, using the voltage between the base and the emitter of the transistor as the threshold value, the operating voltages on the timers for setting the turn-off delay time and the turn-off time can be raised as much as the voltage corresponding to the forward voltage drop in the reverse-blocking diodes. This is in the interest of preventing malfunctioning of the reverse-bias control circuit due to low base-emitter voltage in the transistor. As a result, a highly reliable voltage-driven switching element with a reverse-bias control circuit is obtained.

Preferably, a reverse-bias control circuit is disposed near its voltage-driven switching element and integrated on the same chip, forming a modular wire-bonded semiconductor device. As a result, the drive circuit can be kept small, thereby minimize wiring induction, and thereby preventing malfunctioning due to surge-voltages in the reverse-bias control circuit.

Figure 1:
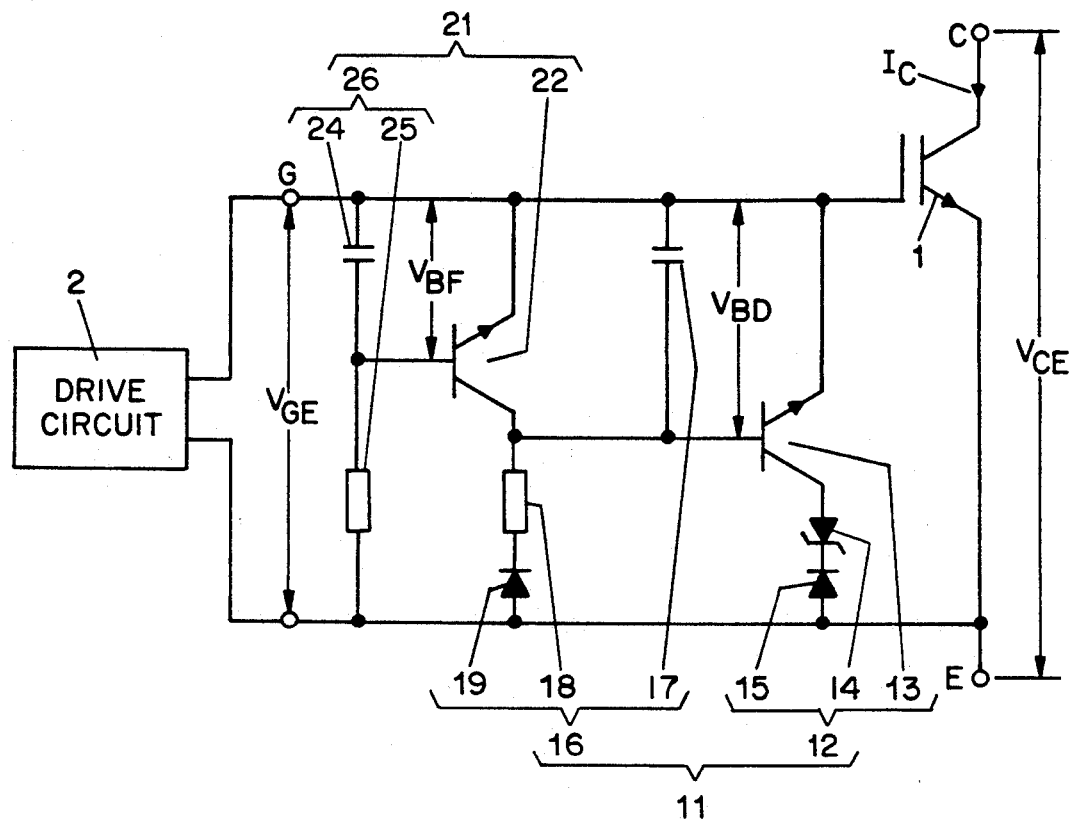
FIG. 1 is a circuit diagram of a reverse-bias control circuit according to a preferred first embodiment of the present invention, applied to an IGBT.

As illustrated by FIG. 1, a reverse-bias control circuit is connected parallel to the gate G and the emitter E of the IGBT 1 which represents a voltage-driven switching element to which the bias voltage $V_{GE}$ from the drive circuit 2 is applied. The reverse-bias control circuit consists of the voltage-step-down circuit 11 and the recovery circuit 21. The voltage-step-down circuit 11 comprises a voltage-step-down section 12 and a timer 16 for setting the turn-off delay, connected parallel to the voltage-step-down section 12. The voltage-step-down section 12 comprises the NPN transistor 13, and the Zener diode 14 and reverse-blocking diode 15 connected in series in the forward direction of the NPN transistor 13, with the emitter of the transistor 13 connected to the gate G of the IGBT 1. The turn-off delay-setting timer 16 comprises the capacitor 17 connected between the base and the emitter of the transistor 13, and the resistor 18 and reverse-blocking diode 19 connected in series to the base of the transistor 13.

The recovery circuit 21 comprises the NPN transistor 22 connected in parallel between the emitter and the base of the transistor 13, and the turn-off time-setting timer 26 which receives the bias voltage $V_{GE}$. The turn-off time-setting timer 26 comprises the capacitor 24 and the resistor 25 in series, with the series-midpoint connected to the base of the transistor 22. The reverse-blocking diode 19 and the resistor 18 in the turn-off delay-setting timer 16 also form a path for the collector current in the transistor 22. Thus, for simplicity, for compactness, and for single-chip integration, the reverse-bias control circuit includes only two transistors, three diodes and two RC timers.

Figure 2:
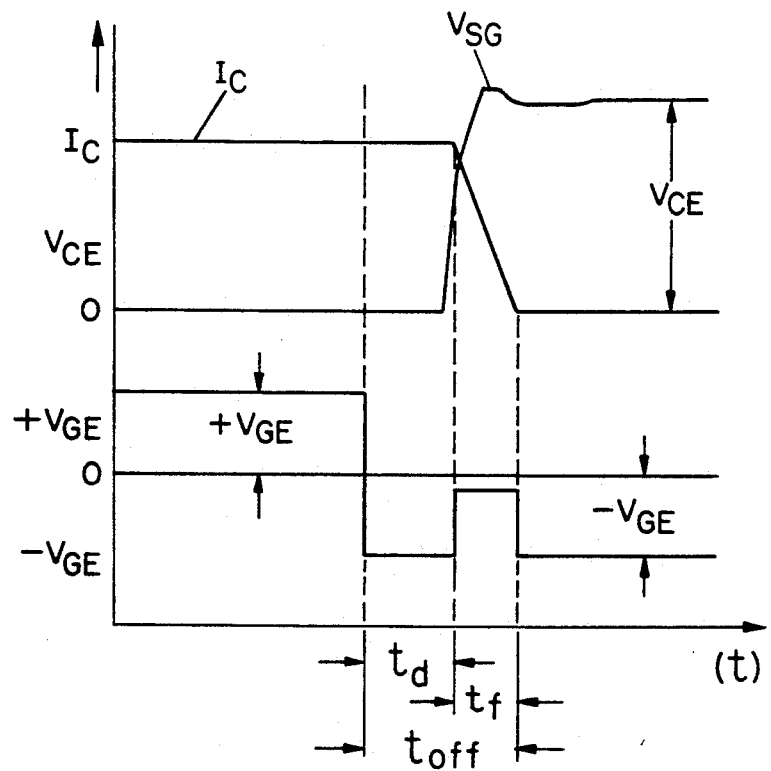
FIG. 2 is a timing diagram for the first embodiment.

In an IGBT with reverse-bias control circuit as described above, the turn-off delay-setting timer 16 has a time constant such that, initially, the charging voltage in the capacitor 17 reaches the voltage $V_{BD}$ (threshold value) between the base and the emitter of the transistor 13 with as much delay as the turn-off delay (shown in FIG. 2 as $t_d$). The turn-off time-setting timer 26 has its time constant initially set so that the charging voltage in the capacitor 24 reaches the voltage $V_{BF}$ (threshold value) between the base and the emitter of the transistor (22) with as much delay as the turn-off time, $t_{off}$, of the IGBT.

When the bias voltage $V_{GE}$ from the drive circuit 2 changes from the forward-bias voltage $+V_{GE}$ to the reverse-bias voltage $-V_{GE}$ as shown in FIG. 2, the capacitor 17 is charged by the reverse-bias voltage via the reverse-blocking diode 19 and the resistor 18. The reverse-bias voltage $-V_{GE}$ is applied between the gate and the emitter in the IGBT until the charging voltage reaches the threshold value $V_{BD}$ in the transistor 13, i.e., for a time corresponding to the turn-off delay, $t_d$, in the IGBT. Immediately thereafter, the transistor 13 is turned on, the voltage-step-down section 12 is activated, and the reverse-bias voltage between the gate and the emitter in the IGBT is decreased to the voltage predetermined by the Zener voltage in the Zener diode 14.

Also, when the bias voltage $V_{GE}$ changes from a forward-bias voltage to a reverse-bias voltage, the turn-off time-setting timer 26 starts operation, so that the transistor 22 turns on with as much delay as the time it takes the charging voltage at the capacitor 24 to reach the transistor's threshold value $V_{BF}$, i.e., the time corresponding to the turn-off time, $t_{off}$, of the IGBT. When the transistor 22 turns on, the capacitor 17 is discharged and the transistor 13 goes into a turn-off state causing the voltage step-down circuit 11 to stop decreasing the voltage. The IGBT maintains its turn-off state while the reverse-bias voltage $-V_{GE}$ is applied, until the forward-bias voltage is applied again between the gate and the emitter to turn the IGBT on.

In this reverse-bias control circuit for an IGBT, because the decrease in the voltage is limited to the duration of the fall time, $t_f$, in the collector current, $I_c$, (see FIG. 2), the rate of change di/dt of the collector current is reduced without affecting the turn-off delay time, $t_d$. Also, a lesser surge voltage, $V_{SG}$, is superposed with the collector-to-emitter voltage, $V_{GE}$, in the IGBT.

It is readily appreciated that, with equivalent effects, a reverse-bias control circuit as described with reference to FIGS. 1 and 2 can be applied to a power MOSFET.

Figure 3:
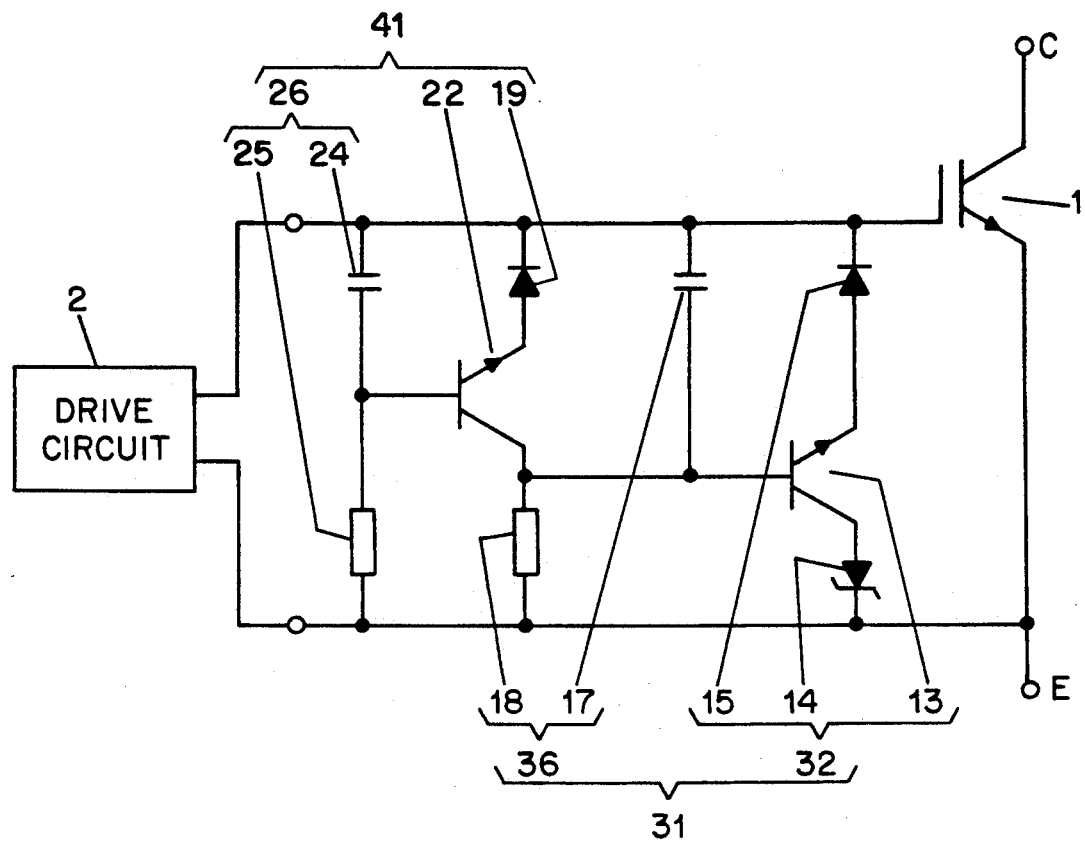
FIG. 3 is a circuit diagram of a reverse-bias control circuit according to a preferred second embodiment of the invention.

In the embodiment illustrated by FIG. 3 as compared with FIG. 1, a reverse-bias control circuit differs in that, in the voltage step-down section 32 of the voltage step-down circuit 31, the reverse-blocking diode 15 is connected to the emitter of the transistor 13, the turn-off delay-setting timer 36 includes a resistor 18 and a capacitor 17, and the reverse-blocking diode 19 is connected to the emitter of the transistor 22 in the recovery circuit 41. The voltage between the base and the emitter, which is a threshold value for the actions of the transistors 13 and 22, is typically as low as 0.8 volt. This implies the possibility of so-called (single transistor) noise malfunctioning. However, by connecting the reverse-blocking diodes 15 and 19 to the emitters of both transistors, the threshold values $V_{BD}$ and $V_{BF}$ can be raised as much as the voltage corresponding to the forward direction drop of the reverse blocking diodes, to prevent malfunctioning. Thus, a voltage-driven switching element equipped with a reverse-bias control circuit and with operational reliability is obtained simply, by shifting the connection position of the reverse-element diode. Additionally, the reverse-element diode serves to block a current flowing into the reverse-bias control circuit when the IGBT is forward-biased between the gate and the emitter.

Figure 4:
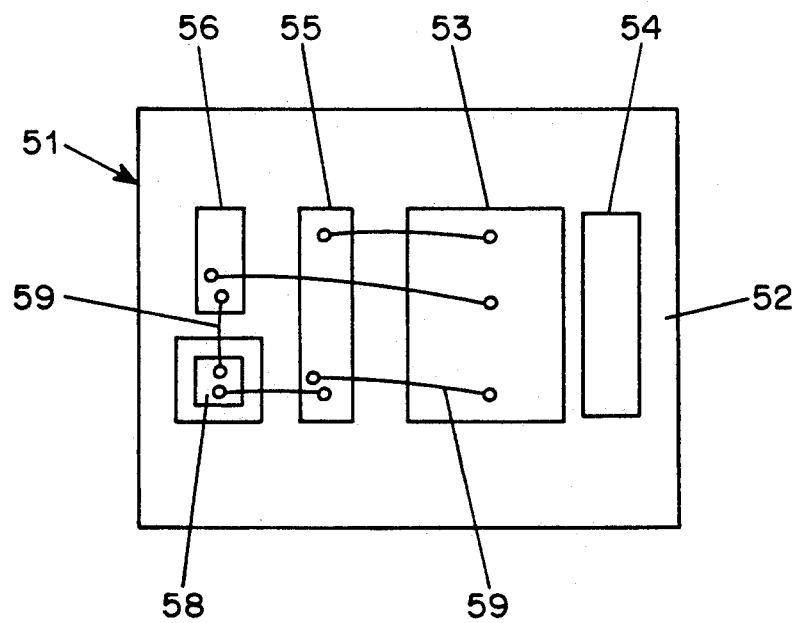
FIG. 4 is a schematic plan view of a semiconductor device equipped with a reverse-bias control circuit according to a third preferred embodiment of the invention.
Figure 5:
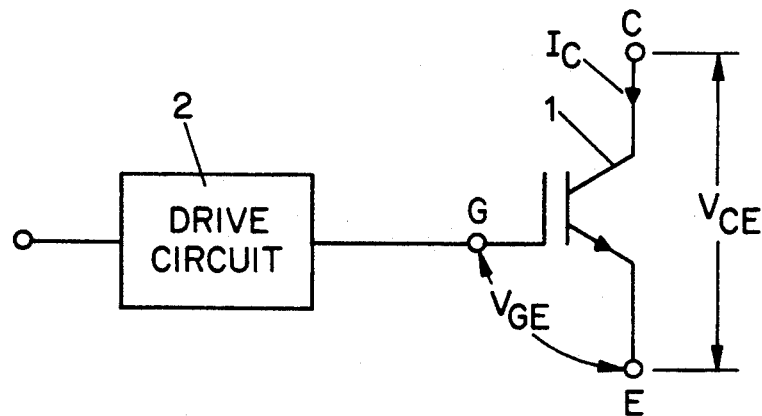
FIG. 5 is a circuit diagram of a conventional switching circuit with an IGBT voltage-driven switching element.
Figure 6:
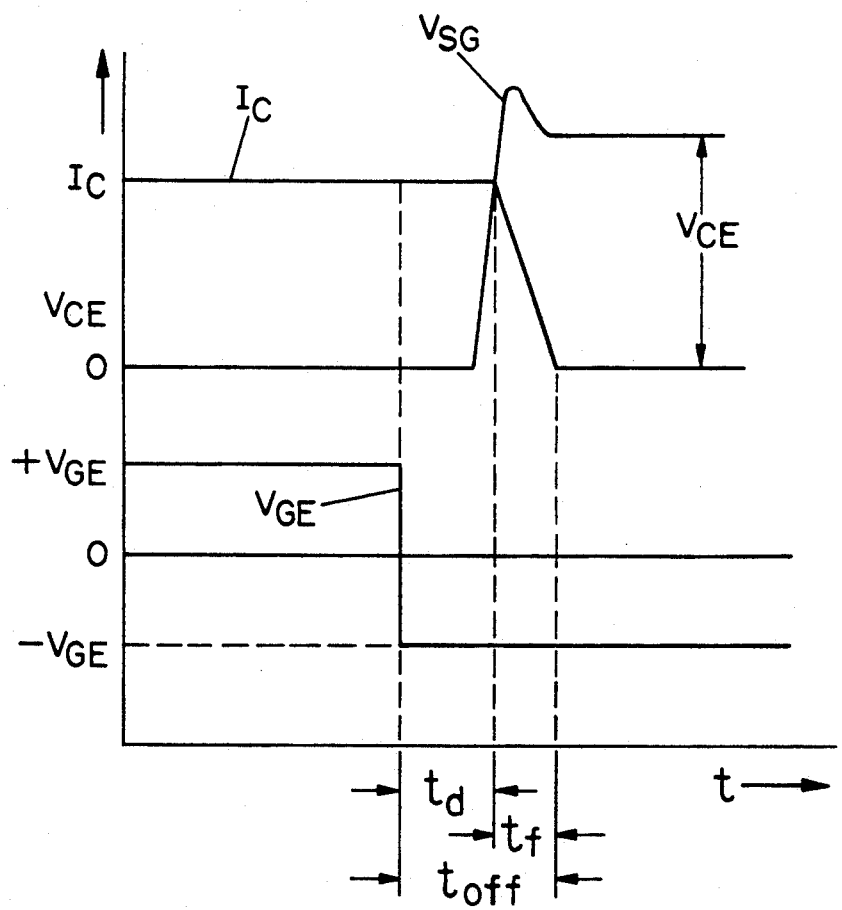
FIG. 6 is a timing diagram for turn-off in the conventional switching circuit.

In the embodiment illustrated by FIG. 4, a voltage-driven switching-element module 51 with reverse-bias control circuit includes a voltage-driven switching-element chip 53, a collector terminal 54, an emitter terminal 55, and a gate terminal 56 on a substrate 52. The module includes a reverse-bias control-circuit (single) chip 58 near chip 53. Bonding wires 59 provide for electroconductive interconnection.

With the reverse-bias control circuit integrated in this fashion, the drive circuit can be reduced in size, to reduce wiring induction and to prevent malfunctioning due to surge voltages in the reverse-bias control circuit.

I claim:

1. A reverse-bias control circuit for preventing voltage surges in a voltage-driven switching element which turns on upon a forward-bias voltage and turns off upon a reverse-bias voltage, and which has a characteristic turn-off delay, a characteristic total turn-off time and a characteristic fall time upon the application of said reverse-bias voltage, said characteristic turn-off delay and characteristic total turn-off time commencing at the application of said reverse-bias voltage, said total turn-off time being equal to the sum of the turn-off delay and the characteristic fall time of said voltage-driven switching element, comprising:

step-down circuit means for temporarily stepping down a reverse-bias voltage from a normal level after a delay corresponding to a first time interval substantially equal to the turn-off delay of said voltage-driven switching element to thereby prevent said voltage surges; and recovery-circuit means for stopping operation of said step-down circuit means at the end of a second time interval substantially equal to the total turn-off time of said voltage-driven switching element to thereby restore the reverse bias voltage to the normal level.

2. The reverse-bias control circuit of claim 1, wherein the step-down circuit means comprises a step-down section and a first timer circuit in parallel connection with the step-down section, connected between an emitter/source terminal and a base/gate terminal of the voltage-driven switching element.

3. The reverse-bias control circuit of claim 2, wherein the step-down section comprises a first transistor, a Zener diode and a first reverse-blocking diode in series connection.

4. The reverse-bias control circuit of claim 2, wherein the first timer circuit comprises a first resistor and a first capacitor in series connection, chosen such that their RC time constant is substantially equal to the first time interval.

5. The reverse-bias control circuit of claim 1, wherein the recovery-circuit means comprises a second transistor and a second timer circuit.

6. The reverse-bias control circuit of claim 5, wherein the second timer circuit comprises a second resistor and a second capacitor in series connection, chosen such that their RC time constant is substantially equal to the second time interval.

7. The reverse-bias control circuit of claim 6, wherein the recovery-circuit means further comprises a second reverse-blocking diode.

8. The reverse-bias control circuit of claim 1, wherein the voltage-driven switching element is an IGBT.

9. The reverse-bias control circuit of claim 1, wherein the voltage-driven switching element is a MOSFET.

10. The reverse-bias control circuit of claim 1, in modular combination with the voltage-driven switching element on a common substrate and wire-bonded to the voltage-driven switching element.

* * * * *